United States Patent
Kim et al.

(10) Patent No.: US 10,903,285 B2
(45) Date of Patent: Jan. 26, 2021

(54) INPUT SENSOR, METHOD FOR MANUFACTURING THE SAME, AND DISPLAY DEVICE HAVING THE SAME

(71) Applicant: Samsung Display Co., Ltd., Yongin-Si (KR)

(72) Inventors: Jae Neung Kim, Yongin-si (KR); Do Hyun Kwon, Yongin-si (KR); Choong Youl Im, Yongin-si (KR); Chang Yong Jung, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/145,458

(22) Filed: Sep. 28, 2018

(65) Prior Publication Data

US 2019/0103443 A1 Apr. 4, 2019

(30) Foreign Application Priority Data

Sep. 29, 2017 (KR) .................. 10-2017-0127903

(51) Int. Cl.
*G06F 3/044* (2006.01)
*H01L 27/32* (2006.01)
*H01L 51/52* (2006.01)
*G06F 3/041* (2006.01)

(52) U.S. Cl.
CPC ............ *H01L 27/323* (2013.01); *G06F 3/044* (2013.01); *G06F 3/0412* (2013.01); *H01L 51/5253* (2013.01); *G06F 2203/04103* (2013.01); *G06F 2203/04111* (2013.01); *G06F 2203/04112* (2013.01); *H01L 27/3244* (2013.01)

(58) Field of Classification Search
CPC ............... H01L 27/323; H01L 27/3244; H01L 51/5253; G06F 3/0412; G06F 3/044; G06F 2203/04103; G06F 2203/04111; G06F 2203/04112
See application file for complete search history.

(56) References Cited

U.S. PATENT DOCUMENTS

| | | | |
|---|---|---|---|
| 9,553,134 B2 | 1/2017 | Nam et al. | |
| 2015/0060823 A1* | 3/2015 | Furuie | H01L 27/3223 257/40 |
| 2017/0345880 A1* | 11/2017 | Kim | H01L 51/5253 |
| 2018/0175116 A1* | 6/2018 | Song | G06F 3/044 |

FOREIGN PATENT DOCUMENTS

KR 10-2015-0087713 A 7/2015

* cited by examiner

*Primary Examiner* — William Boddie
(74) *Attorney, Agent, or Firm* — Innovation Counsel LLP

(57) ABSTRACT

There are provided an input sensor having improved input sensing sensitivity, a method for manufacturing the input sensor, and a display device having the input sensor.

18 Claims, 10 Drawing Sheets

INPUT SENSOR, METHOD FOR MANUFACTURING THE SAME, AND DISPLAY DEVICE HAVING THE SAME

RELATED APPLICATIONS

The present application claims priority to Korean Patent Application No. 10-2017-0127903, filed on Sep. 29, 2017, in the Korean Intellectual Property Office, the entire disclosure of which is incorporated by reference herein.

BACKGROUND

1. Field

An aspect of the present disclosure relates to an input sensor, a method for manufacturing the same, and a display device having the same.

2. Description of the Related Art

Recent display devices have been developed to include an information input function along with an image display function. The information input function of the display devices may be generally implemented by an input sensor for receiving a touch of a user.

The input sensor may be attached to one surface of a display panel that implements an image display function or be integrally formed with the display panel. A user may input information by pressing or touching the input sensor while viewing an image displayed by the display panel.

SUMMARY

Embodiments provide an input sensor having improved input sensing sensitivity, a method for manufacturing the input sensor, and a display device having the input sensor.

According to an aspect of the present disclosure, there is provided an input sensor including: a base part including a sensing region and a peripheral region disposed at the periphery of the sensing region; a plurality of sensing electrodes provided in the sensing region; an insulating layer provided on the base part and insulating the plurality of sensing electrodes insulated from each other; and a plurality of signal lines connected to the plurality of sensing electrodes, the plurality of signal lines being arranged to be spaced apart from each other, wherein the thickness of the insulating layer corresponding to the sensing region is different from that of the insulating layer corresponding to the peripheral region.

The thickness of the insulating layer corresponding to the peripheral region may be thicker than that of the insulating layer corresponding to the sensing region.

When the signal lines are provided on the insulating layer corresponding to the peripheral region, the distance between the signal lines and the base part may be larger than the thickness of the insulating layer corresponding to the sensing region.

The plurality of sensing electrodes may have a mesh pattern.

The plurality of sensing electrodes may include a first mesh pattern and a second mesh pattern provided on the first mesh pattern. The insulating layer may be provided between the first mesh pattern and the second mesh pattern, and the second mesh pattern may be electrically connected to the first mesh pattern by at least one contact hole passing through the insulating layer.

The thickness of the insulating layer disposed between the signal lines and the base part may be thicker than that of the insulating layer disposed between the first mesh pattern and the second mesh pattern.

The signal lines may be connected to the second mesh pattern, and include the same material as the second mesh pattern.

The plurality of sensing electrodes may include: a first sensing electrode formed to extend in a first direction; and a second sensing electrode formed to extend in a second direction intersecting the first direction. The first sensing electrode may include a plurality of first sensor parts arranged along the first direction and a first connection part allowing the first sensor parts to be connected to each other, and the second sensing electrode may include a plurality of second sensor parts arranged along the second direction and a second connection part allowing the second sensor parts to be connected to each other. The first sensor parts and the second sensor parts may be disposed on the same layer or on different layers, and one of the first connection part and the second connection part may be disposed on the same layer as the first sensor parts.

According to an aspect of the present disclosure, there is provided a display device including: a display panel including a display region and a non-display region disposed at the periphery of the display region; and an input sensor provided on the display panel, wherein the input sensor includes: a base part including a sensing region and a peripheral region disposed at the periphery of the sensing region; a plurality of sensing electrodes provided in the sensing region; an insulating layer provided on the base part and insulating the plurality of sensing electrodes insulated from each other; and a plurality of signal lines connected to the plurality of sensing electrodes, the plurality of signal lines being arranged to be spaced apart from each other, wherein the thickness of the insulating layer corresponding to the sensing region is different from that of the insulating layer corresponding to the peripheral region.

The display panel may include: a substrate; a light emitting device provided on the substrate; and an encapsulation layer covering the light emitting device, the encapsulation layer including one or more layers.

The thickness of the insulating layer corresponding to the peripheral region may be thicker than that of the insulating layer corresponding to the sensing region.

When the signal lines are provided on the insulating layer corresponding to the peripheral region, the distance between the signal lines and the base part may be larger than the thickness of the insulating layer corresponding to the sensing region.

The plurality of sensing electrodes may have a mesh pattern.

The plurality of sensing electrodes may include a first mesh pattern and a second mesh pattern provided on the first mesh pattern. The insulating layer may be provided between the first mesh pattern and the second mesh pattern, and the second mesh pattern may be electrically connected to the first mesh pattern by at least one contact hole passing through the insulating layer.

The thickness of the insulating layer disposed between the signal lines and the base part may be thicker than that of the insulating layer disposed between the first mesh pattern and the second mesh pattern.

The signal lines may be connected to the second mesh pattern, and include the same material as the second mesh pattern.

The plurality of sensing electrodes may include: a first sensing electrode formed to extend in a first direction; and a second sensing electrode formed to extend in a second direction intersecting the first direction. The first sensing electrode may include a plurality of first sensor parts arranged along the first direction and a first connection part allowing the first sensor parts to be connected to each other, and the second sensing electrode may include a plurality of second sensor parts arranged along the second direction and a second connection part allowing the second sensor parts to be connected to each other. The first sensor parts and the second sensor parts may be disposed on the same layer or on different layers, and one of the first connection part and the second connection part may be disposed on the same layer as the first sensor parts.

According to an aspect of the present disclosure, there is provided a method for manufacturing an input sensor, the method including: providing a base part that includes a sensing region and a peripheral region disposed at the periphery of the sensing region; providing a first conductive layer on the base part; forming a first conductive line by patterning the first conductive layer; providing an insulating layer on the base part and the first conductive line; forming a contact hole in the insulating layer such that a portion of the first conductive line is exposed; providing a second conductive layer on the insulating layer to be in contact with the first conductive line through the contact hole; and forming a second conductive line by patterning the second conductive layer, wherein the thickness of the insulating layer corresponding to the peripheral region is formed thicker than that of the insulating layer corresponding to the sensing region.

In the forming of the contact hole, the contact hole may be formed by forming the thickness of the insulating layer corresponding to the peripheral region to be larger than that of the insulating layer corresponding to the sensing region, using a halftone mask.

The method may include, before the providing of the second conductive layer after the forming of the contact hole, forming an additional insulating layer on the insulating layer corresponding to the peripheral region.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
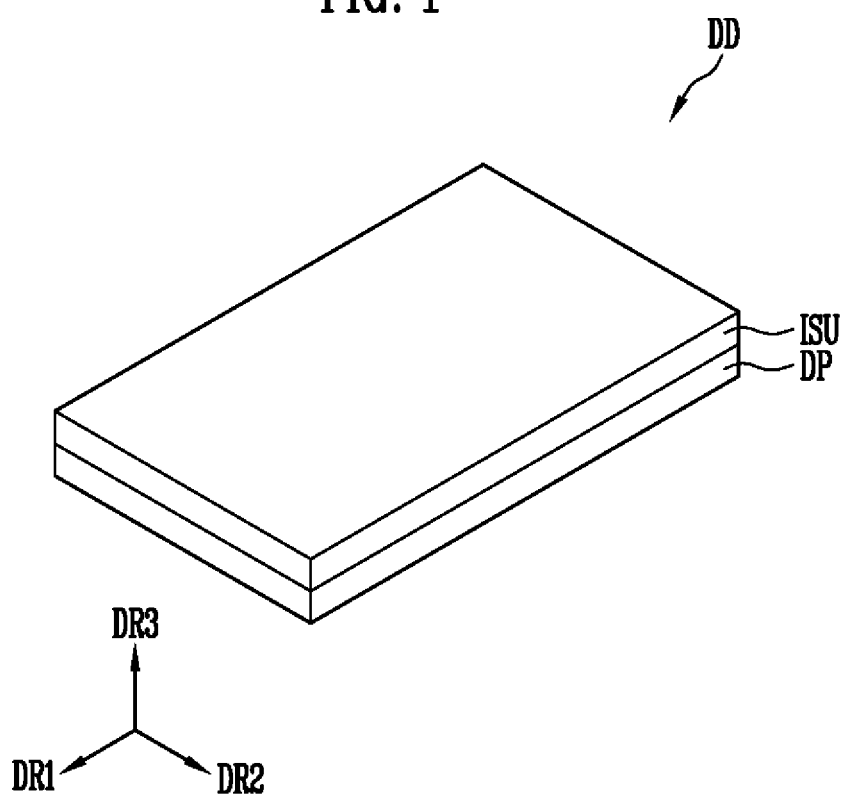
FIG. 1 is a perspective view of a display device according to an embodiment of the present disclosure.

The present disclosure may apply various changes and different shape, therefore only illustrate in details with particular examples. However, the examples do not limit to certain shapes but apply to all the change and equivalent material and replacement. The drawings included are illustrated a fashion where the figures are expanded for the better understanding.

Like numbers refer to like elements throughout. In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

Hereinafter, exemplary embodiments of the present disclosure will be described in detail with reference to the accompanying drawings.

Figure 2:
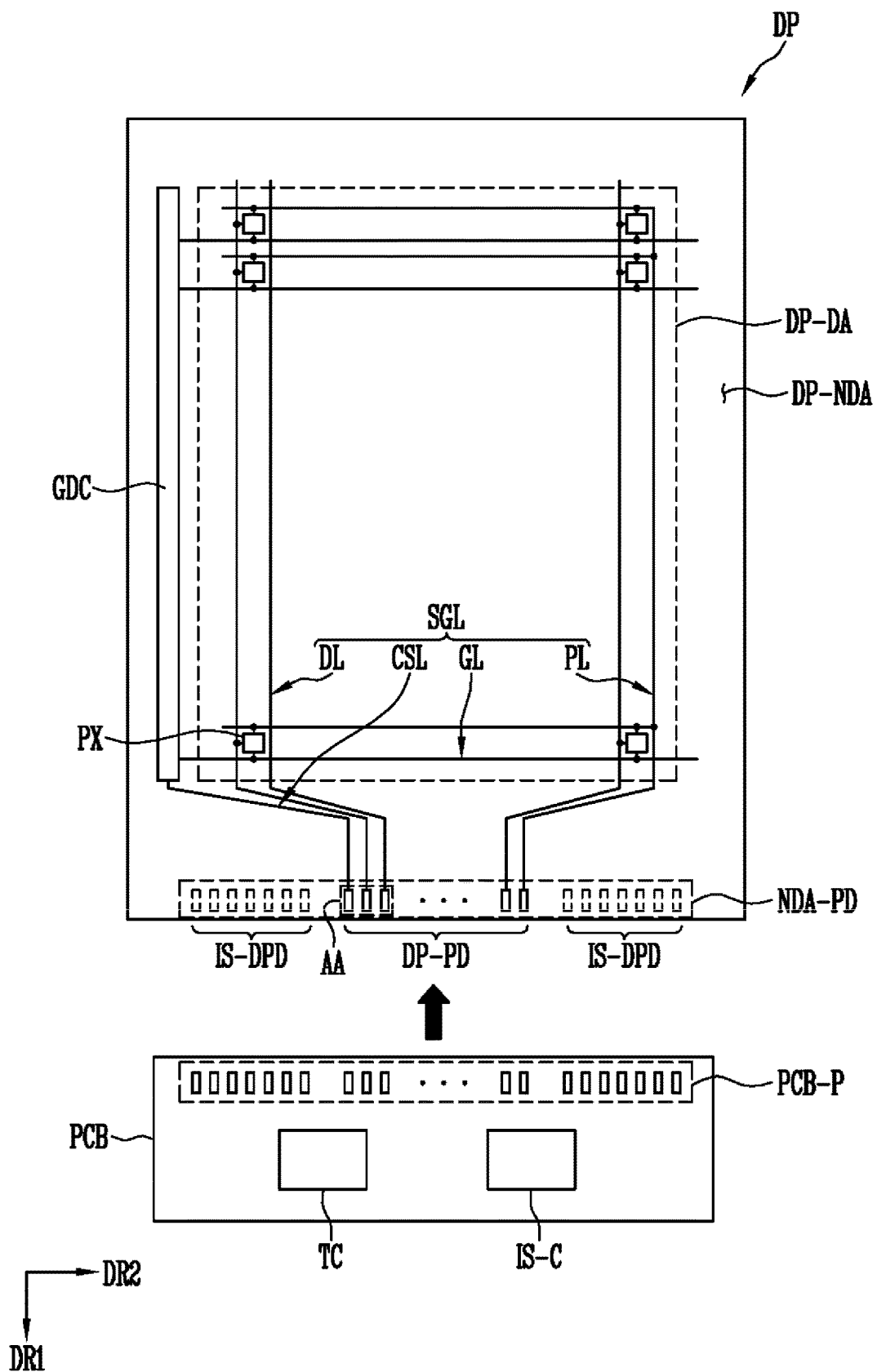
FIG. 2 is a plan view of a display panel according to an embodiment of the present disclosure.

FIG. 1 is a perspective view of a display device DD according to an embodiment of the present disclosure. FIG. 2 is a plan view of a display panel according to an embodiment of the present disclosure.

Referring to FIGS. 1 and 2, the display device DD may be provided in various shapes. For example, the display device DD may be provided in a quadrangular plate shape having two pairs of sides parallel to each other. When the display device DD is provided in a rectangular plate shape, one pair of sides among the two pairs of sides may be provided longer than the other pair of sides.

The display device DD according to the embodiment of the present disclosure may display an image through a display surface. The display surface may be parallel to a surface defined by a first directional axis DR1 and a second directional axis DR2. A normal direction of the display surface, i.e., a thickness direction of the display device DD may be indicated by a third directional axis DR3.

The display device DD may include a display panel DP in which display elements (not shown) are provided and an input sensor ISU for recognizing a touch.

The display panel DP may include a display region DP-DA in which an image is displayed and a non-display region DP-NDA provided at at least one side of the display region DP-DA.

The display panel DP may display arbitrary visual information, e.g., a text, a video, a picture, a two-dimensional or three-dimensional image, etc. Hereinafter the arbitrary visual information is referred to as an "image." The kind of the display panel DP is not particularly limited to ones that display images.

The display region DP-DA may be located at a central portion of the display panel DP and have an area relatively larger than that of the non-display region DP-NDA. The display region DP-DA may have various shapes. For example, the display region DP-DA may be provided in various shapes such as a closed polygon including linear sides, a circle, an ellipse, etc., including curved sides, and a semicircle, a semi-ellipse, etc., including linear and curved sides. When the display region DP-DA includes a plurality of regions, each region may also be provided in various shapes such as a closed polygon including linear sides, a circle, an ellipse, etc., including curved sides, and a semicircle, a semi-ellipse, etc., including linear and curved sides. In addition, the plurality of regions may have areas equal to or different from one another. In an embodiment of the present disclosure, a case where the display region DP-DA is provided as one region having a quadrangular shape including linear sides is described as an example.

The non-display region DP-NDA may be provided at at least one side of the display region DP-DA. In an embodiment of the present disclosure, the non-display region DP-NDA may surround the circumference of the display region DP-DA. In an embodiment of the present disclosure, the non-display region DP-NDA may include a longitudinal part extending along the first directional axis DR1 and a lateral part extending along the second directional axis DR2. The lateral part of the non-display region DP-NDA may be provided in a pair spaced apart from each other along the width direction of the display region DP-DA.

The display region DP-DA may include a plurality of pixel regions in which a plurality of pixels PX are provided. A pad portion provided with pads and signal lines may be provided in the non-display region DP-NDA. As another example, a data driver (not shown) for providing a data signal to the pixels PX may be provided in the non-display region DP-NDA. The data driver may provide the data signal to each of the pixels PX through data lines. Here, the data driver may be disposed at the lateral part of the non-display region DP-NDA, and extend long along the width direction of the non-display region DP-NDA.

The display panel DP may include a driving circuit GDC, a plurality of signal lines SGL (hereinafter, referred to as signal lines), a plurality of signal pads DP-PD (hereinafter, referred to as signal pads), and a plurality of pixels PX (hereinafter, referred to as pixels). The pixels PX may be arranged in the display region DP-DA. Each of the pixels PX may include an organic light emitting diode and a pixel driving circuit connected to the organic light emitting diode. The driving circuit GDC, the signal lines SGL, the signal pads DP-PD, and the pixel driving circuit may be included in a circuit element layer DP-CL shown in FIG. 5.

The driving circuit GDC may include a scan driving circuit. The scan driving circuit may generate a plurality of scan signals (hereinafter, referred to as scan signals), and sequentially output the scan signals to a plurality of scan lines GL (hereinafter, referred to as scan lines) which will be described later. The scan driving circuit may further output another control signal to driving circuits of the pixels PX.

The scan driving circuit may include a plurality of thin film transistors formed through the same process as the driving circuits of the pixels PX, e.g., a low temperature polycrystalline silicon (LTPS) process or a low temperature polycrystalline oxide (LTPO) process.

The signal lines SGL may include scan lines GL, data lines DL, a power line PL, and a control signal line CSL. Each of the scan lines GL may be connected to corresponding pixels PX among the pixels PX, and each of the data lines DL may be connected to corresponding pixels PX among the pixels PX. The power line PL is connected to the pixels PX. The control signal line CSL may provide control signals to the scan driving circuit.

The signal lines SGL may overlap with the display region DP-DA and the non-display region DP-NDA. Each of the signal lines SGL may include a pad part and a line part. The line part may overlap with the display region DP-DA and the non-display region DP-NDA. The pad part is connected to an end of the line part. The pad part is disposed in the non-display region DP-NDA in a pad region NDA-PD. This will be described in detail later. The region in which the signal pads DP-PD are arranged in the non-display region DP-NDA may be defined as the pad region NDA-PD.

The line part connected to the pixel PX substantially constitutes a majority of the signal line SGL. The line part may be connected to transistors T (see FIG. 5) of the pixel PX. The line part may have a single-/multi-layered structure. The line part may be formed in a single body or include two or more parts. The two or more parts may be disposed in different layers, and be connected to each other through a contact hole passing through an insulating layer disposed between the two or more parts.

The display panel DP may further include dummy pads IS-DPD arranged in the pad region NDA-PD. Since the dummy pads IS-DPD are formed through the same process as the signal lines SGL, the dummy pads IS-DPD may be disposed on the same layer as the signal lines SGL. The dummy pads IS-DPD may be selectively provided in the display device DD including an input sensing layer. The dummy pads IS-DPD may be omitted in the display device DD including the input sensor ISU as shown in FIG. 1.

A printed circuit board PCB electrically connected to the display panel DP is additionally illustrated in FIG. 2. The printed circuit board PCB may be a rigid or flexible printed circuit board. The printed circuit board PCB may be directly coupled to the display panel DP or be connected to the display panel DP through another printed circuit board.

A timing controller TC for controlling an operation of the display panel DP may be disposed on the printed circuit board PCB. In addition, an input sensing circuit IS-C for controlling the input sensor ISU may be disposed on the printed circuit board PCB. Each of the timing controller TC and the input sensing circuit IS-C may be mounted on the printed circuit board PCB in the form of an integrated circuit (IC) chip. As another example, the timing controller TC and the input sensing circuit IS-C may be mounted on the printed circuit board PCB in the form of one IC chip. The printed circuit board PCB may include printed circuit board pads PCB-P electrically connected to the display panel DP. Although not shown in the drawings, the printed circuit board PCB may further include signal lines that connect the printed circuit board pads PCB-P to the timing controller TC and/or the input sensing circuit IS-C.

Figure 3:
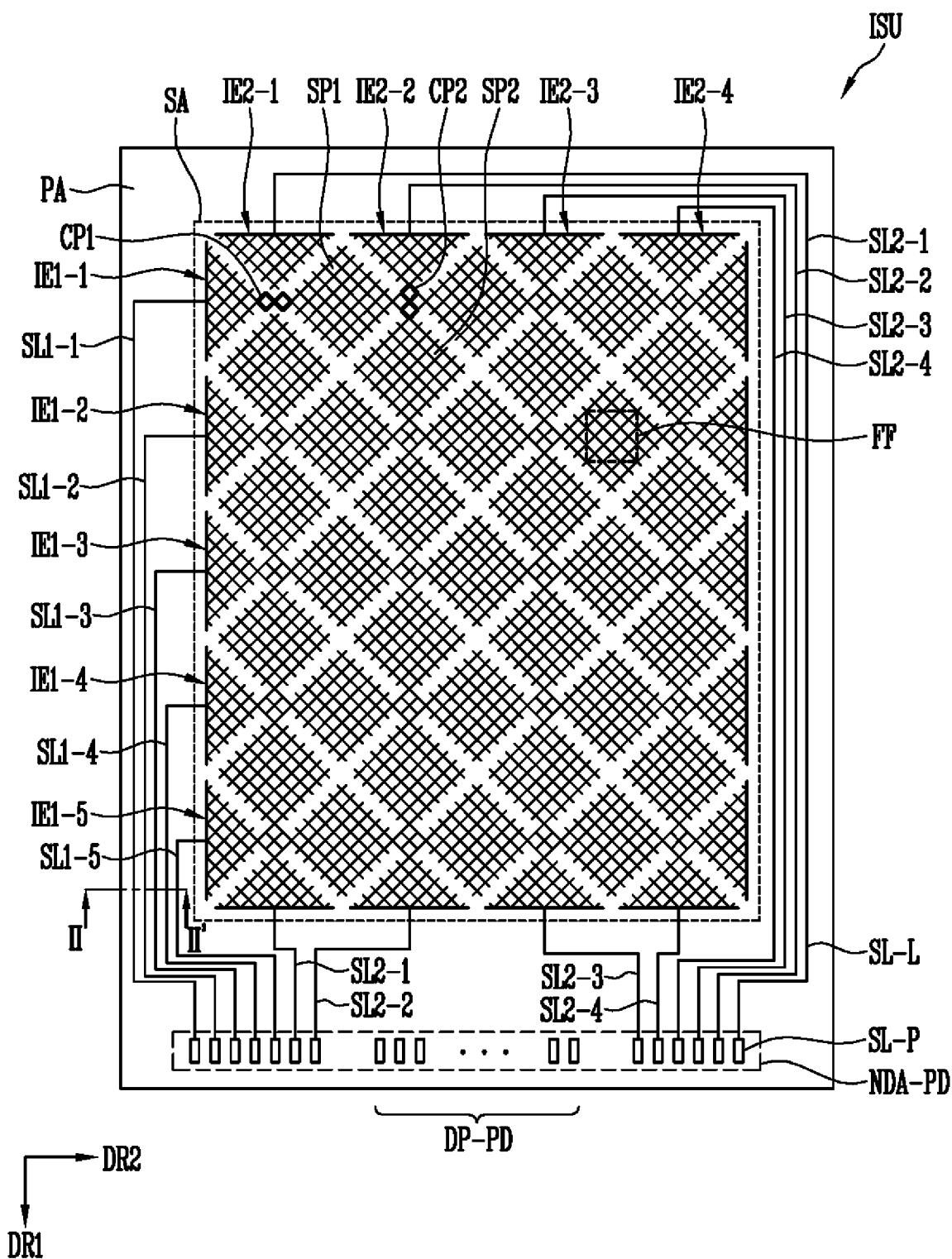
FIG. 3 is a plan view of an input sensor according to an embodiment of the present disclosure.
Figure 4:
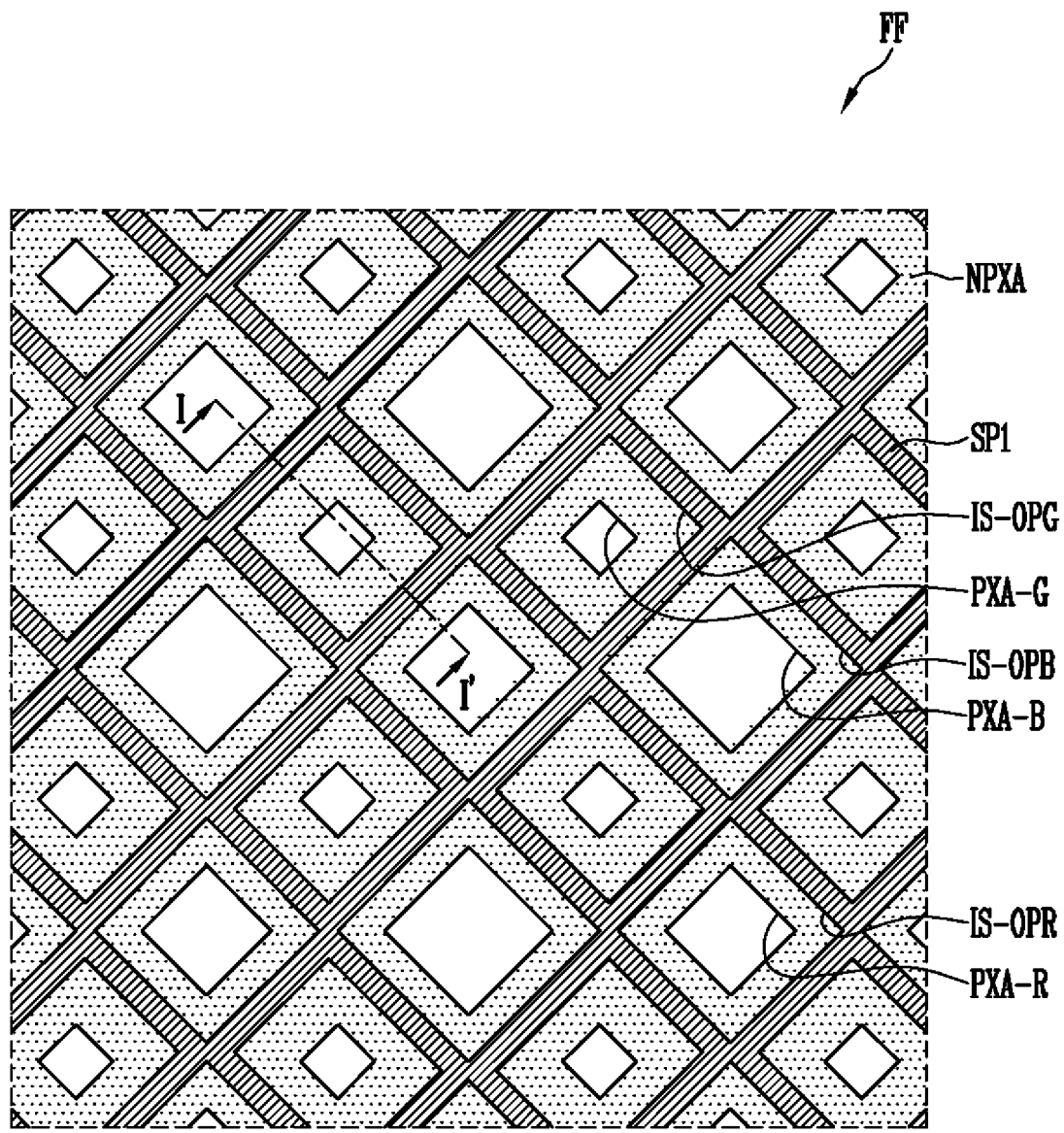
FIG. 4 is an enlarged plan view of region FF shown in FIG. 3.

FIG. 3 is a plan view of an input sensor ISU according to an embodiment of the present disclosure. FIG. 4 is an enlarged plan view of region FF shown in FIG. 3.

Referring to FIGS. 3 and 4, the input sensor ISU according to the embodiment of the present disclosure may include a sensing region SA for sensing an input of a user, e.g., a touch and/or a pressure when the touch is input, and a peripheral region PA provided at at least one side of the sensing region SA.

The sensing region SA may correspond to the display region DP-DA of the display panel DP. The sensing region SA may have the substantially same area as the display region DP-DA or have an area larger than that of the display region DP-DA. The peripheral region PA may be disposed adjacent to the sensing region SA. Also, the peripheral region PA may correspond to the non-display region DP-NDA of the display panel DP, and include a lateral part and a longitudinal part.

The input sensor ISU may include first sensing electrodes IE1-1 to IE1-5 and second sensing electrodes IE2-1 to IE2-4, which are provided in the sensing region SA, and first signal lines SL1-1 to SL1-5 and second signal lines SL2-1 to SL2-4, which are provided in the peripheral region PA.

First sensor parts SP1 in one first sensing electrode are arranged along a second directional axis DR2, and second sensor parts SP2 in one second sensing electrode are arranged along a first directional axis DR1. Each of first connection parts CP1 may connect adjacent first sensor parts SP1, and each of second connection parts CP2 may connect adjacent second sensor parts SP2.

The first sensing electrodes IE1-1 to IE1-5 and the second sensing electrodes IE2-1 to IE2-4 may have mesh patterns. The mesh pattern may include mesh lines as metal lines, which form at least one mesh hole IS-OPR, IS-OPG, and IS-OPB.

As the first sensing electrodes IE1-1 to IE1-5 and the second sensing electrodes IE2-1 to IE2-4 may have the mesh pattern, parasitic capacitances of the sensing electrodes with electrodes of the display panel DP can be decreased.

In addition, as will be described later, the first sensing electrodes IE1-1 to IE1-5 and the second sensing electrodes IE2-1 to IE2-4 do not overlap with emission regions PXA-R, PXA-G, and PXA-B. Thus, the first sensing electrodes IE1-1 to IE1-5 and the second sensing electrodes IE2-1 to IE2-4 are not viewed by a user.

The first sensing electrodes IE1-1 to IE1-5 and the second sensing electrodes IE2-1 to IE2-4, which have the mesh pattern, may include aluminum, copper, chromium, nickel, titanium, etc. However, the present disclosure is not limited thereto, and the sensing electrodes may be made of various metals.

As an example, when the first sensing electrodes IE1-1 to IE1-5 and the second sensing electrodes IE2-1 to IE2-4 is made of a metal that can be formed through a low temperature process, damage of organic light emitting diodes OLED (see FIG. 5) can be prevented even though the input sensor ISU is formed after a manufacturing process of the display panel DP.

In detail, a thin film encapsulation layer TFE instead of a glass encapsulation layer may be used as a capping layer in manufacturing of a flexible display device. The thin film encapsulation layer TFE has a thickness thinner than that of the glass encapsulation layer. Hence, when the sensing electrodes of the input sensor are formed on the thin film encapsulation layer TFE after forming the display panel DP, a display element layer DP-OLED of the display panel DP may be damaged due to heat generated when the sensing electrodes are formed. When the sensing electrodes are formed of a metal that can be formed through a low temperature process, the damage of the display element layer DP-OLED can be minimized even though the input sensor is formed after forming the display panel.

As another example, the first sensing electrodes IE1-1 to IE1-5 and the second sensing electrodes IE2-1 to IE2-4 may be made of a metal that can be formed through a high temperature process.

When the first sensing electrodes IE1-1 to IE1-5 and the second sensing electrodes IE2-1 to IE2-4 are directly arranged as the mesh pattern on the display panel DP, the flexibility of the display device DD can be improved.

The first sensing electrodes IE1-1 to IE1-5 and the second sensing electrodes IE2-1 to IE2-4, which are shown in FIG. 3, include the first sensor parts SP1 and the second sensor part SP2, which have a diamond shape. The present disclosure is not limited thereto, and the first sensor parts SP1 and the second sensor part SP2 may have another polygonal shape. The first sensing electrodes IE1-1 to IE1-5 and the second sensing electrodes IE2-1 to IE2-4 may have a bar shape which cross each other.

The first signal lines SL1-1 to SL1-5 may be respectively connected to one ends of the first sensing electrodes IE1-1 to IE1-5. The second signal lines SL2-1 to SL2-4 may be connected to both ends of the second sensing electrodes IE2-1 to IE2-4. In another embodiment of the present disclosure, the first signal lines SL1-1 to SL1-5 may also be connected to both ends of the first sensing electrodes IE1-1 to IE1-5. In still another embodiment of the present disclosure, the second signal lines SL2-1 to SL2-4 may be respectively connected to only one ends of the second sensing electrodes IE2-1 to IE2-4.

The sensing sensitivity of the input sensor ISU including the second signal lines SL2-1 to SL2-4 connected to both ends of the second sensing electrodes IE2-1 to IE2-4 as shown in FIG. 3 can be improved as compared with the input sensor ISU including the second signal lines SL2-1 to SL2-4 respectively connected to only one ends of the second sensing electrodes IE2-1 to IE2-4. Since the second sensing electrodes IE2-1 to IE2-4 have a length longer than that of the first sensing electrodes IE1-1 to IE1-5, a large voltage drop of a detection signal (or transmission signal) provided through the second sensing electrodes IE2-1 to IE2-4 occurs as compared with the first sensing electrodes IE1-1 to IE1-5, and therefore, the sensing sensitivity may be reduced. According to the embodiment of the present disclosure, a detection signal (or transmission signal) is provided through the second signal lines SL2-1 to SL2-4 connected to both ends of the second sensing electrodes IE2-1 to IE2-4, so that a voltage drop of the detection signal (or transmission signal) can be prevented, thereby preventing reduction of the sensing sensitivity.

The location of the first signal lines SL1-1 to SL1-5 and the second signal lines SL2-1 to SL2-4 may be interchangeable. Unlike as shown in FIG. 3, the first signal lines SL1-1 to SL1-5 may be disposed at a left side, and the second signal lines SL2-1 to SL2-4 may be disposed at a right side.

The first signal lines SL1-1 to SL1-5 and the second signal lines SL2-1 to SL2-4 may include line parts SL-L and pad parts SL-P. The pad parts SL-P may be aligned in a pad region NDA-PD. The pad parts SL-P may overlap with the dummy pads IS-DPD shown in FIG. 2. The line part SL-L may be configured with a first conductive line MTL1 formed in a single layer. This will be described later.

The input sensor ISU may include signal pads DP-PD. The signal pads DP-PD may be aligned in the pad region NDA-PD.

Meanwhile, in an embodiment of the present disclosure, the first signal lines SL1-1 to SL1-5 and the second signal lines SL2-1 to SL2-4 may be replaced by a printed circuit board or the like, which is separately manufactured to be coupled to the input sensor ISU.

FIG. 4 is an enlarged view of region FF shown in FIG. 3.

Referring to FIG. 4, the first sensor part SP1 may not overlap with emission regions PXA-R, PXA-G, and PXA-B, and may overlay with a non-emission region NPXA. Each of the emission regions PXA-R, PXA-G, and PXA-B may be defined identically to an emission region PXA shown in FIG. 5.

Mesh lines (metal lines) of the first sensor part SP1 may define a plurality of mesh holes IS-OPR, IS-OPG, and IS-OPB (hereinafter, referred to as mesh holes). The mesh holes IS-OPR, IS-OPG, and IS-OPB may correspond one by one to openings of the emission regions PXA-R, PXA-G, and PXA-B. That is, the emission regions PXA-R, PXA-G, and PXA-B may be exposed by the mesh holes IS-OPR, IS-OPG, and IS-OPB, respectively.

The line width of the mesh line may be smaller than the width of a pixel defining layer PDL corresponding to the non-emission region NPXA.

As described above, the mesh lines are formed on the non-emission region NPXA, and do not encroach on the emission regions PXA-R, PXA-G, and PXA-B. Thus, it can be minimized that light emitted from the emission regions PXA-R, PXA-G, and PXA-B is blocked by the mesh lines, and it is possible to prevent the mesh lines from being viewed by a user.

As an example, the mesh lines may have a triple-layered structure of titanium/aluminum/titanium.

The emission regions PXA-R, PXA-G, and PXA-B may be divided into a plurality of groups according to colors of light emitted from organic light emitting diodes OLED. In FIG. 4, the emission regions PXA-R, PXA-G, and PXA-B divided into three groups according to colors of emitted light are illustrated.

The emission regions PXA-R, PXA-G, and PXA-B may have different areas according to colors of light emitted from emitting layers EML of the organic light emitting diodes OLED. The areas of the emission regions PXA-R, PXA-G, and PXA-B may be determined according to kinds of organic light emitting diodes.

The mesh holes IS-OPR, IS-OPG, and IS-OPB may be divided into a plurality of groups having different areas. The mesh holes IS-OPR, IS-OPG, and IS-OPB may be divided into three groups according to the emission regions PXA-R, PXA-G, and PXA-B.

In the above, it is illustrated that the mesh holes IS-OPR, IS-OPG, and IS-OPB correspond one by one to the emission regions PXA-R, PXA-G, and PXA-B, but the present disclosure is not limited thereto. Each of the mesh holes IS-OPR, IS-OPG, and IS-OPB may correspond to two or more of the emission regions PXA-R, PXA-G, and PXA-B.

A case where the areas of the emission regions PXA-R, PXA-G, and PXA-B are different is illustrated as an example, but the present disclosure is not limited thereto. The sizes of the emission regions PXA-R, PXA-G, and PXA-B may be equal to one another, and the sizes of the mesh holes IS-OPR, IS-OPG, and IS-OPB may also be equal to one another. The planar shape of the mesh holes IS-OPR, IS-OPG, and IS-OPB is not limited thereto, and the mesh holes IS-OPR, IS-OPG, and IS-OPB may have a polygonal shape different from the diamond shape. The planar shape of the mesh holes IS-OPR, IS-OPG, and IS-OPB may have a polygonal shape having rounded corner portions.

Figure 5:
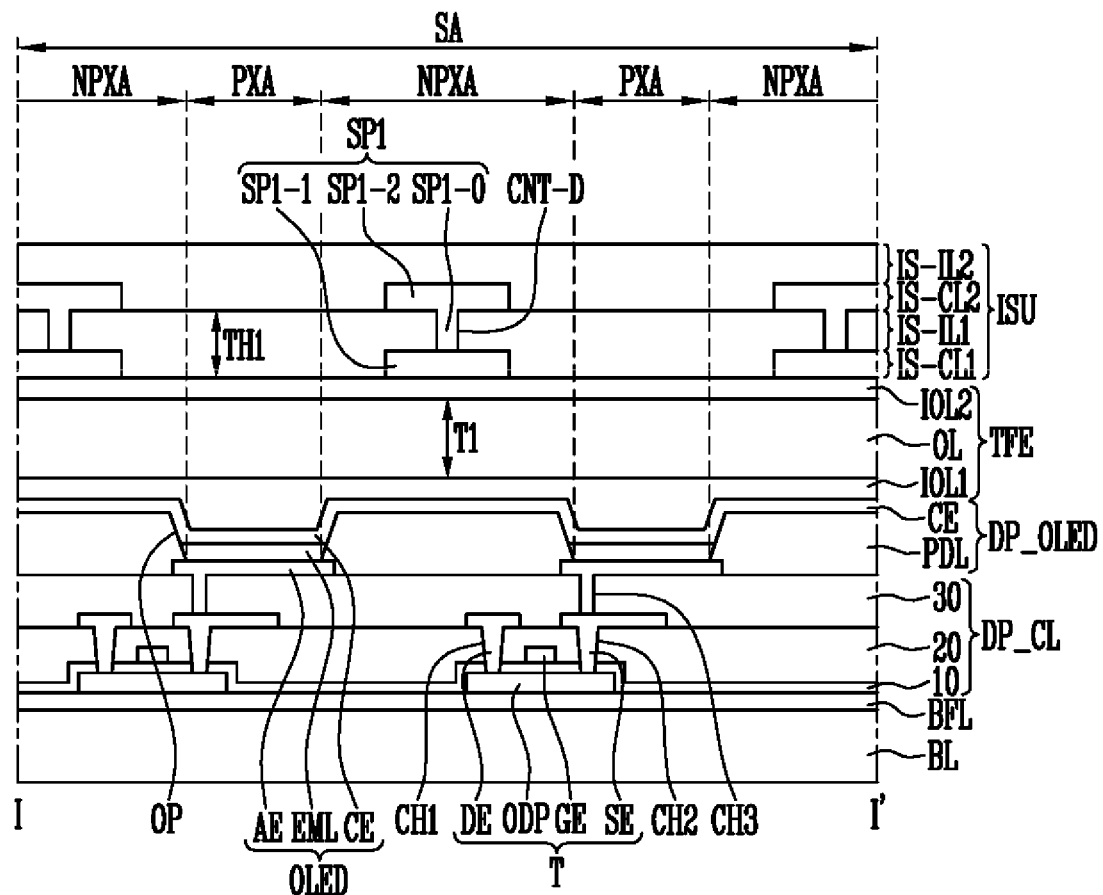
FIG. 5 is a sectional view of the display device taken along line I-I' shown in FIG. 4.

FIG. 5 is a sectional view of the display device taken along line I-I' shown in FIG. 4. FIG. 5 shows a portion of the sensing region SA.

Referring to FIG. 5, a base layer BL may be made of various materials, e.g., glass, polymer metal, and the like. In particular, the base layer BL may be an insulative substrate made of a polymer organic material. The material of the insulative substrate including the polymer organic material may include polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, and the like. However, the material constituting the base layer BL is not limited thereto. For example, the base layer BL may be made of a fiber reinforced plastic (FRP), etc.

A buffer layer BFL may be provided on the base layer BL. The buffer layer BFL may prevent impurities from being diffused into a thin film transistor T provided on the first base layer BL, and improve the flatness of the base layer BL. The buffer layer BFL may be provided in a single layer, but be formed in a multi-layer including at least two layers. The buffer layer BFL may be an inorganic insulating layer made of an inorganic material. For example, the buffer layer BFL may be formed of silicon nitride, silicon oxide, silicon oxynitride, or the like. When the buffer layer BFL is provided in the multi-layer, the layers may be formed of the same material or different materials. The buffer layer BFL may be omitted in some cases.

A semiconductor pattern ODP of the transistor T may be disposed on the buffer layer BFL. The semiconductor pattern ODP may be selected from amorphous silicon, poly-silicon, and a metal oxide semiconductor.

A first intermediate inorganic layer 10 may be disposed over the semiconductor pattern ODP. A control electrode GE may be disposed on the first intermediate inorganic layer 10. The control electrode GE may be manufactured through the same photolithography process as the scan lines (GL of FIG. 2).

A second intermediate inorganic layer 20 covering the control electrode GE may be disposed on the first intermediate inorganic layer 10. An input electrode DE and an output electrode SE of the transistor T may be disposed on the second intermediate inorganic layer 20.

The input electrode DE and the output electrode SE may be connected to the semiconductor pattern ODP through a first through-hole CH1 and a second through-hole CH2, which pass through the first intermediate inorganic layer 10 and the second intermediate inorganic layer 20. Meanwhile, in another embodiment of the present disclosure, the transistor T may be formed in a bottom gate structure.

An intermediate organic layer 30 covering the input electrode DE and the output electrode SE is disposed on the second intermediate inorganic layer 20. The intermediate organic layer 30 may provide a flat surface.

A display element layer DP-OLED is disposed on the intermediate organic layer 30. The display element layer DP-OLED may include a pixel defining layer and an organic light emitting diode OLED.

The pixel defining layer PDL may include an organic material. A first electrode AE may be disposed on the intermediate organic layer 30. The first electrode AE may be connected to the output electrode SE through a third through-hole CH3 passing through the intermediate organic layer 30. An opening OP is defined in the pixel defining layer PDL. The opening OP of the pixel defining layer PDL may allow at least a portion of the first electrode AE to be exposed therethrough. As a modification, the pixel defining layer PDL may be omitted.

The pixel (PX of FIG. 2) may be disposed in the display region DP-DA. The display region DP-DA may include an emission region PXA and a non-emission region NPXA adjacent to the emission region PXA. The non-emission region NPXA may surround the emission region PXA. The emission region PXA may be defined to correspond to the portion of the first electrode AE, which is exposed by the opening OP. The non-emission region NPXA may be defined to correspond to the pixel defining layer PDL.

The emission region PXA may overlap with the transistor T. The opening OP may be further widened, and the first electrode AE and an emitting layer EML which will be described later may also be further widened.

The organic light emitting diode OLED may include the first electrode AE connected to the output electrode SE, the emitting layer EML disposed on the first electrode AE, and a second electrode CE disposed on the emitting layer EML.

One of the first electrode AE and the second electrode CE may be an anode electrode, and the other of the first electrode AE and the second electrode CE may be a cathode electrode. For example, the first electrode AE may an anode electrode, and the second electrode CE may be a cathode electrode.

In addition, at least one of the first electrode AE and the second electrode CE may be a transmissive electrode. For example, when the organic light emitting diode OLED is a bottom emission type organic light emitting device, the first electrode AE may be a transmissive electrode, and the second electrode CE may be a reflective electrode. When the organic light emitting diode OLED is a top emission type organic light emitting device, the first electrode AE may be a reflective electrode, and the second electrode CE may be a transmissive electrode. When the organic light emitting diode OLED is a double-sided emission type organic light emitting device, both of the first electrode AE and the second electrode CE may be transmissive electrodes. In this embodiment, a case where the organic light emitting diode OLED is a top emission type organic light emitting device, and the first electrode AE is an anode electrode is described as an example.

In each emission region, the first electrode AE may be disposed on the intermediate organic layer 30. The first electrode AE may include a reflective layer (not shown) capable of reflecting light and a transparent conductive layer (not shown) disposed on the top or bottom of the reflective layer. At least one of the reflective layer and the transparent conductive layer may be connected to the output electrode SE.

The reflective layer may include a material capable of reflecting light. For example, the reflective layer may include at least one of aluminum (Al), silver (Ag), chromium (Cr), molybdenum (Mo), platinum (Pt), nickel (Ni), and any alloy thereof.

The transparent conductive layer may include transparent conductive oxide. For example, the transparent conductive layer may include at least one transparent conductive oxide selected from indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

The emitting layer EML may be disposed on the exposed surface of the first electrode AE. The emitting layer EML may have a multi-layered thin film structure including at least a light generation layer (LGL). For example, the emitting layer EML may include a hole injection layer (HIL) for injecting holes, a hole transport layer (HTL) having an excellent hole transporting property, the HTL for increasing the opportunity for holes and electrons to be re-combined by suppressing the movement of electrons that fail to be combined in the LGL, the LGL for emitting light through the re-combination of the injected electrons and holes, a hole blocking layer (HBL) for suppressing the movement of holes that fail to be combined in the LGL, an electron transport layer (ETL) smoothly transporting electrons to the LGL, and an electron injecting layer (EIL) for injecting electrons.

The color of light generated in the LGL may be one of red, green, blue, and white, but this embodiment is not limited thereto. For example, the color of light generated in the LGL of the emitting layer EML may also be one of magenta, cyan, and yellow.

At least one of the HIL, the HTL, the HBL, the ETL and the EIL may be common layers connected in adjacent emission regions.

The second electrode CE may be disposed on the emitting layer EML. The second electrode CE may be a semi-transmissive reflective layer. For example, the second electrode CE may be a thin metal layer having a thickness, through which light can be transmitted. The second electrode CE may allow a portion of the light emitted from the LGL to be transmitted therethrough, and reflect the rest of the light emitted from the LGL.

The second electrode CE may include a material having a work function lower than that of the transparent conductive layer. For example, the second electrode CE may be include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Jr), chromium (Cr), lithium (Li), calcium (Ca), and any alloy thereof.

A portion of the light emitted from the emitting layer EML is not transmitted through the second electrode CE, and the light reflected from the second electrode CE may be again reflected from the reflective layer. That is, the light emitted from the emitting layer EML may resonate between the reflective layer and the second electrode CE. The light extraction efficiency of the display element OLED can be improved by the resonance of the light.

A distance between the reflective layer and the second electrode CE may be changed depending on a color of the light emitted from the LGL. That is, the distance between the reflective layer and the second electrode CE may be adjusted to correspond to a resonance distance, depending on the color of the light emitted from the LGL.

A thin film encapsulation layer TFE may be disposed over the second electrode CE. The thin film encapsulation layer TFE is commonly disposed over the pixels PX. In this embodiment, the thin film encapsulation layer TFE directly covers the second electrode CE. In an embodiment of the present disclosure, a capping layer covering the second electrode CE may be further disposed between the thin film encapsulation layer TFE and the second electrode CE. In this case, the thin film encapsulation layer TFE may directly cover the capping layer.

In an embodiment, the thin film encapsulation layer TFE may include a first encapsulation inorganic layer IOL1, an encapsulation layer OL, and a second encapsulation inorganic layer IOL2, which are sequentially stacked over the second electrode CE as shown in FIG. 5. The encapsulation inorganic layers may be made of an inorganic insulating material including polysiloxane, silicon nitride, silicon oxide, silicon oxynitride, and the like. The encapsulation organic layer may be made of an organic insulating material including a polyacryl-based compound, a polyimide-based compound, a fluorine-based compound such as Teflon, a benzocyclobutene-based compound, and the like.

In another embodiment, the thin film encapsulation layer TFE may include n (n is a natural number of 2 or more) encapsulation inorganic layers including the first encapsulation inorganic layer IOL1 that is in contact with the second electrode CE. Also, the thin film encapsulation layer TFE may include (n-1) encapsulation organic layer OL. The (n-1) encapsulation organic layers OL may be alternately disposed with the n encapsulation inorganic layers. The (n-1) encapsulation organic layers OL may have a thickness averagely larger than that of the n encapsulation inorganic layers.

Each of the n encapsulation inorganic layers may be a single layer including one material, or multiple layers including different materials. The (n-1) encapsulation organic layers OL may be formed by depositing organic monomers. For example, the organic monomers may include an acryl-based monomer, but the present disclosure is not particularly limited.

An input sensor ISU may be provided on the thin film encapsulation layer TFE. The input sensor ISU may include a first conductive layer IS-CL1, a first insulating layer IS-IL1, a second conductive layer IS-CL2, and a second insulating layer IS-IL2. Each of the first conductive layer IS-CL1 and the second conductive layer IS-CL2 may have a single-layered structure or have a multi-layered structure in which layers are stacked along the third directional axis DR3.

The conductive layer having the single-layered structure may include a metal layer or a transparent conductive layer. The metal layer may include molybdenum, silver, titanium, copper, aluminum, and any alloy thereof. The transparent conductive layer may include a transparent conductive oxide such as indium tin oxide (ITO), indium zinc oxide (IZO), zinc oxide (ZnO), or indium tin zinc oxide (ITZO). In addition, the transparent conductive layer may include a conductive polymer such as PEDOT, a metal nano wire, graphene, and the like.

The conductive layer having the multi-layered structure may include multiple metal layers. The multiple metal layers may include, for example, a triple-layered structure of titanium/aluminum/titanium. The conductive layer having the multi-layered structure may include at least one metal layer and at least one transparent conductive layer.

Each of the first conductive layer IS-CL1 and the second conductive layer IS-CL2 may include a plurality of patterns. Hereinafter, the first conductive layer IS-CL1 may include first conductive patterns, and the second conductive layer IS-CL2 may include second conductive patterns. Each of the first conductive patterns and the second conductive patterns may include the above-described sensing electrodes and signal lines.

The stacked structure and material of the sensing electrodes may be determined by considering sensing sensitivity. RC delay may have influence on the sensing sensitivity. Since the metal layer has a resistance smaller than that of the transparent conductive layer, the sensing electrodes including the metal layer have a time constant, i.e., an RC value smaller than that of the sensing electrode including the transparent conductive layer. In the input sensor, the RC value refers to a charging time of a capacitor defined between the sensing electrodes. Hence, the sensing electrodes including the metal layer have a short charging time of the capacitor, as compared with the sensing electrode including the transparent conductive layer, so that the sensing sensitivity can be improved. On the other hand, the sensing electrodes including the transparent conductive layer are not viewed by a user and have a wide input area, as compared with the sensing electrodes including the metal layer, so that the capacitance of the capacitor can be increased. The sensing electrodes including the metal layer, as described above, may have a mesh shape so as to prevent the sensing electrodes from being viewed by a user.

Meanwhile, the thickness T1 of the thin film encapsulation layer TFE may be adjusted such that noise generated by the components of the display element layer DP-OLED does not have influence on the input sensor ISU. Each of the first insulating layer IS-IL1 and the second insulating layer IS-IL2 may have a single-layered or multi-layered structure. Each of the first insulating layer IS-IL1 and the second insulating layer IS-IL2 may include an inorganic material, an organic material, or a composite material.

At least one of the first insulating layer IS-IL1 and the second insulating layer IS-IL2 may include an inorganic layer. The inorganic layer may include at least one of aluminum oxide, titanium oxide, silicon oxide, silicon oxynitride, zirconium oxide, and hafnium oxide.

At least one of the first insulating layer IS-IL1 and the second insulating layer IS-IL2 may include an organic layer. The organic layer may include at least one of acryl-based resin, methacryl-based resin, polyisoprene, vinyl-based resin, epoxy-based resin, urethane-based resin, cellulose-based resin, siloxane-based resin, polyimide-based resin, polyamide-based resin, and perylene-based resin.

The input sensor ISU may have a base corresponding to the display panel DP. In other words, the base may be a surface that faces the display panel DP. The display region and the non-display region of the display panel DP may correspond to the sensing region SA and the peripheral region PA of the base of the input sensor ISU.

Referring to FIGS. 3 to 5, the first sensor part SP1 of the first sensing electrodes IE1-1 to IE1-5 may be configured with a metal layer having a double-layered mesh shape that includes a first mesh pattern SP1-1 and a second mesh pattern SP1-2. That is, the second mesh pattern SP1-2 may be located on the first mesh pattern SP1-1, and the first insulating layer IS-IL1 may be interposed between the second mesh pattern SP1-2 and the first mesh pattern SP1-1. A connection contact hole CNT-D may be formed in the first insulating layer IS-IL1, and a contact part SP1-0 may be formed in the connection contact hole CNT-D, so that the first mesh pattern SP1-1 and the second mesh pattern SP1-2 can be electrically connected to each other. The contact part SP1-0 may be made of a conductive material. As an example, the contact part SP1-0 may be formed of the same material as the first mesh pattern SP1-1 and the second mesh pattern SP1-2 for convenience of processes. As another example, the contact part SP1-0 may be made of a material having an electrical conductivity higher than that of the first mesh pattern SP1-1 or the second mesh pattern SP1-2.

The second insulating layer IS-IL2 may be formed over the second mesh pattern SP1-2. The second insulating layer IS-IL2 may serve as a planarization layer.

Like the first sensor part SP1 of the first sensing electrodes IE1-1 to IE1-5, the second sensing part SP2 of the second sensing electrodes IE2-1 to IE2-4 may be configured with a metal layer having a double-layered mesh shape that includes two mesh patterns. The two mesh patterns may be disposed with the first insulating layer IS-IL1 interposed therebetween, and be electrically connected to each other by a contact part through a connection contact hole CNT-D formed in the first insulating layer IS-IL1.

As described above, the sensing electrode includes the first mesh pattern SP1-1 and the second mesh pattern SP1-2, and the first mesh pattern SP1-1 and the second mesh pattern SP1-2 are electrically connected to each other. Thus, the resistance of the sensing electrode can be decreased, and accordingly, the RC delay can be minimized.

However, the present disclosure is not limited thereto, and the sensing electrode may be configured with a metal layer having a single-layered mesh shape including one mesh pattern.

Figure 6:
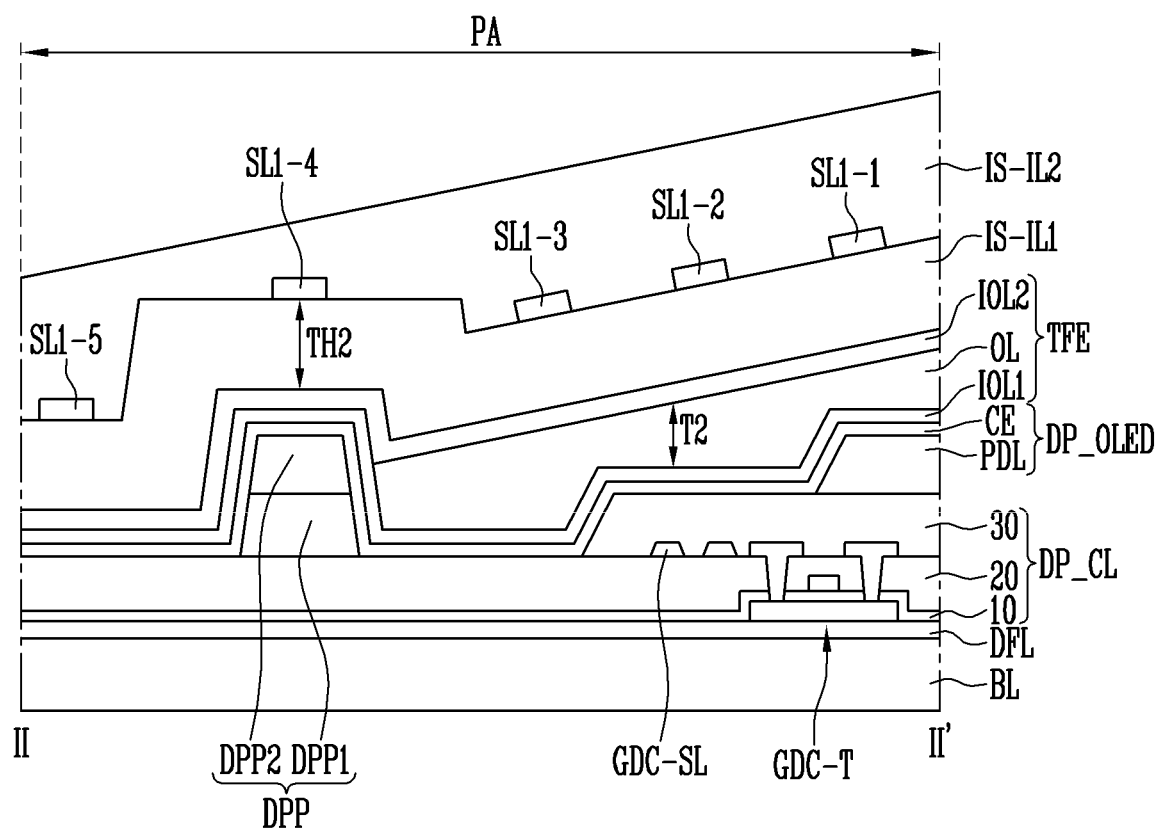
FIG. 6 is a sectional view of the display device taken along line II-II' shown in FIG. 3.

FIG. 6 is a sectional view of the display device taken along line II-II' shown in FIG. 3. FIG. 6 shows a portion of the peripheral region PA. That is, FIG. 6 is a sectional view in the non-display region DP-NDA of the display device. A dam part DPP may be located in the non-display region DP-NDA at the periphery of the display region DP-DA. In addition, other various circuit patterns such as a driving circuit GDC, a power electrode PWE (not shown), and a static electricity preventing pattern (not shown) may be included in the non-display region DP-NDA.

Referring to FIG. 6, the driving circuit GDC included in the display element layer DP-CL is disposed in the non-display region DP-NDA. The driving circuit GDC may include at least one transistor GDC-T formed through the same process as the transistor (T of FIG. 5) of the pixel disposed in the sensing region SA. The driving circuit GDC may include signal lines GDC-SL disposed on the same layer as the input electrode of the transistor T. The driving circuit GDC may be a scan driving circuit, and further include a signal line disposed on the same layer as the control electrode of the transistor T.

The dam part DPP may block an organic material for forming the encapsulation organic layer OL of the thin film encapsulation layer TFE from flowing toward an edge of the base layer BL when the encapsulation organic layer OL is formed. The dam part DPP may be formed to surround the display region DP-DA. The encapsulation organic layer OL may be formed by injecting a liquid organic material on the first encapsulation inorganic layer IOL1, using an inkjet method. In this case, the dam part DPP may define the boundary of a region in which the liquid organic material is disposed.

The dam part DPP may have a multi-layered structure. A lower part DPP1 of the dam part DPP may be simultaneously formed with the intermediate organic layer 30, and an upper part DPP2 of the dam part DPP may be simultaneously formed with the pixel defining layer PDL.

However, the present disclosure is not limited thereto, and the dam part DPP may have a single-layered structure. In addition, two or more dam parts DPP may be provided. When the dam part DPP is provided in plurality, the height of the dam part DPP may increase as the dam part DPP becomes closer to the edge of the base layer BL.

Since the dam part DPP blocks the organic material from flowing toward the edge of the base layer BL when the encapsulation organic layer OL is formed, the encapsulation organic layer OL is located at the inside of the dam part DPP. On the other hand, the encapsulation inorganic layers IOL1 and IOL2 may extend to the outside of the dam part DPP. The encapsulation inorganic layers IOL1 and IOL2 may be in contact with each other at the outside of the damp part DPP.

The sensor parts SP1 and SP2 may be located on the thin film encapsulation layer TFE in the display region DP-DA, and the signal lines SL1-1 to SL-5 may be disposed on the thin film encapsulation layer TFE in the non-display region DP-NDA.

As described above, in the first sensor part SP1-2, the first mesh pattern SP1-1 and the second mesh pattern SP1-2, which are provided in two layers, may be stacked with the first insulating layer IS-IL1 interposed therebetween, and be electrically connected to each other by the connection contact hole CNT-D of the first insulating layer IS-IL1. The first mesh pattern SP1-1, the first insulating layer IS-IL1, the second mesh pattern SP1-2, and the second insulating layer IS-IL2 may be sequentially formed on the second encapsulation inorganic layer IOL2 that is the uppermost layer of the thin film encapsulation layer TFE.

Like the first sensor part SP1, in the second sensor part SP2, the first mesh pattern SP1-1, the first insulating layer IS-IL1, the second mesh pattern SP1-2, and the second insulating layer IS-IL2 may be sequentially formed on the second encapsulation inorganic layer IOL2.

Since the thin film encapsulation layer TFE maintains a flat surface in the display region DP-DA, the distance between the sensor parts SP1 and SP2 and the second electrode CE can be maintained at a certain level. A base capacitance is formed between the mesh patterns SP1-1 and SP1-2 of the sensor parts SP1 and SP2 and the second electrode CE. Since the operating speed of the input sensor ISU is determined according to the base capacitance as described above, the sensitivity of the input sensor ISU can be controlled by adjusting the distance between the mesh patterns SP1-1 and SP1-2 and the second electrode CE. The distance between the mesh patterns SP1-1 and SP1-2 and the second electrode CE is considerably influenced by the thickness of the thin film encapsulation layer TFE, i.e., the thickness of the encapsulation organic layer OL, which is thickest in the thin film encapsulation layer TFE. The thickness of the encapsulation organic layer in the display region DP-DA is maintained at a certain level so as to maintain the sensitivity of the input sensor ISU.

On the other hand, the thickness T2 of the encapsulating organic layer OL in the non-display region DP-NDA is not uniform. The thickness T2 of the encapsulating organic layer OL in the non-display region DP-NDA may be smaller than that T1 of the encapsulation organic layer OL in the display region DP-DA. Therefore, the base capacitance of signal lines disposed on the thin film encapsulation layer TFE in the non-display region DP-NDA may increase.

In more detail, as shown in FIGS. 5 and 6, the encapsulation organic layer OL maintains the flat surface in the display region DP-DA, but may be formed to be inclined in the non-display region DP-NDA. That is, the encapsulation organic layer OL may be formed by injecting the liquid organic material on the first encapsulation inorganic layer IOL1, using the inkjet method as described above. Since the first encapsulation inorganic layer IOL1 has the flat surface in the display region DP-DA, the encapsulation layer OL formed in the display region DP-DA may have a flat surface. However, in the non-display region DP-NDA, the encapsulation organic layer OL is formed as the organic material flowing on the first encapsulation inorganic layer IOL1 formed along the step difference between the pixel defining layer PDL and the intermediate organic layer 30 is blocked by the dam part DPP. Therefore, the encapsulation organic layer OL formed in the non-display region DP-NDA may have an inclined surface.

In addition, the encapsulation layer OL formed in the non-display region DP-NDA is formed as the organic material in the display region DP-DA flows toward the edge of the base layer BL. Therefore, the thickness of the encapsulation organic layer OL in the non-display region DP-NDA is smaller than that of the encapsulation organic layer OL in the display region DP-DA.

Thus, the base capacitance of the signal lines disposed on the thin film encapsulation layer TFE in the non-display region DP-NDA with the second electrode CE increases because the thickness of the encapsulation organic layer OL in the non-display region DP-NDA is thinner than that of the encapsulation organic layer OL in the display region DP-DA. In particular, the distance between the second electrode CE and signal lines that are disposed on the dam part DPP or disposed at the outside of the dam part DPP among the signal lines in which the encapsulation organic layer OL does not exist becomes very short, and therefore, the base capacitance may considerably increase. The input sensing sensitivity of the input sensor ISU may be considerably influenced because the base capacitance considerably increases in regions in which the encapsulation organic layer OL does not exist.

According to the embodiment of the present disclosure, the thickness of the first insulating layer IS-IL1 corresponding to the sensing region SA (i.e., the display region DP-DA) and the thickness of the first insulating layer IS-IL1 corresponding to the peripheral region PA (i.e., the non-display region DP-NDA) are formed different from each other to compensate the difference in the base capacitance between the second electrode CE and the signal lines SL1-1 to SL1-5. As an example, the thickness TH2 of the first insulating layer IS-IL1 corresponding to the peripheral region PA may be formed larger than that TH1 of the first insulating layer IS-IL1 corresponding to the sensing region SA. The signal lines SL1-1 to SL1-5 are provided on the first insulating layer IS-IL1 corresponding to the peripheral region PA, which is formed thicker than the first insulating layer IS-IL1 corresponding to the sensing region SA, so that the distance between the signal lines SL1-1 to SL1-5 and the second electrode CE2 is increased by the thickness TH2 of the first insulating layer IS-IL1. Accordingly, the input sensing sensitivity of the input sensor ISU can be improved by decreasing the base capacitance of the signal lines SL1-1 to SL1-5.

FIGS. 7A to 7E are sectional views of the input sensor, illustrating, step by step, a method for manufacturing the input sensor according to an embodiment of the present disclosure.

Figure 7A:
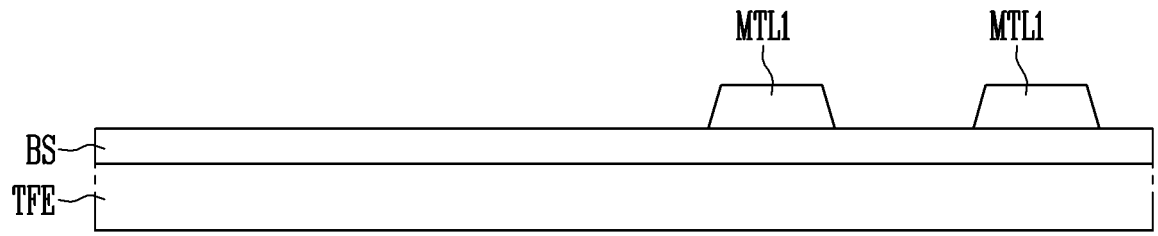
FIGS. 7A, 7B, 7C, 7D and 7E are sectional views of the input sensor, illustrating, step by step, a method for manufacturing the input sensor according to an embodiment of the present disclosure.

Referring to FIG. 7A, first, a base part BS may be formed on a thin film encapsulation layer TFE of the display device DD. The base part BS serves as a buffer layer. The base part BS may be made of an inorganic insulating layer such as silicon nitride (SiNx).

Next, a first conductive layer may be formed on the base part BS. The first conductive layer may be a conductive layer having a single-layered or multi-layered structure.

The conductive layer having the single-layered structure may include a metal layer or a transparent conductive layer. The metal layer may include molybdenum, silver, titanium, copper, aluminum, and any alloy thereof. The transparent conductive layer may include a transparent conductive oxide such as ITO, IZO, ZnO, or ITZO. In addition, the transparent conductive layer may include a conductive polymer such as PEDOT, a metal nano wire, graphene, and the like.

The conductive layer having the multi-layered structure may include multiple metal layers. The multiple metal layers may include, for example, a triple-layered structure of titanium/aluminum/titanium. The conductive layer having the multi-layered structure may include at least one metal layer and at least one transparent conductive layer.

Subsequently, a first conductive line MTL1 may be formed by patterning the first conductive layer. The first conductive line MTL1 may be formed by patterning the first conductive layer, using a patterning mask. The first conductive line MTL1 may be formed in a sensing region SA, and may not be formed in a peripheral region PA.

Figure 7B:
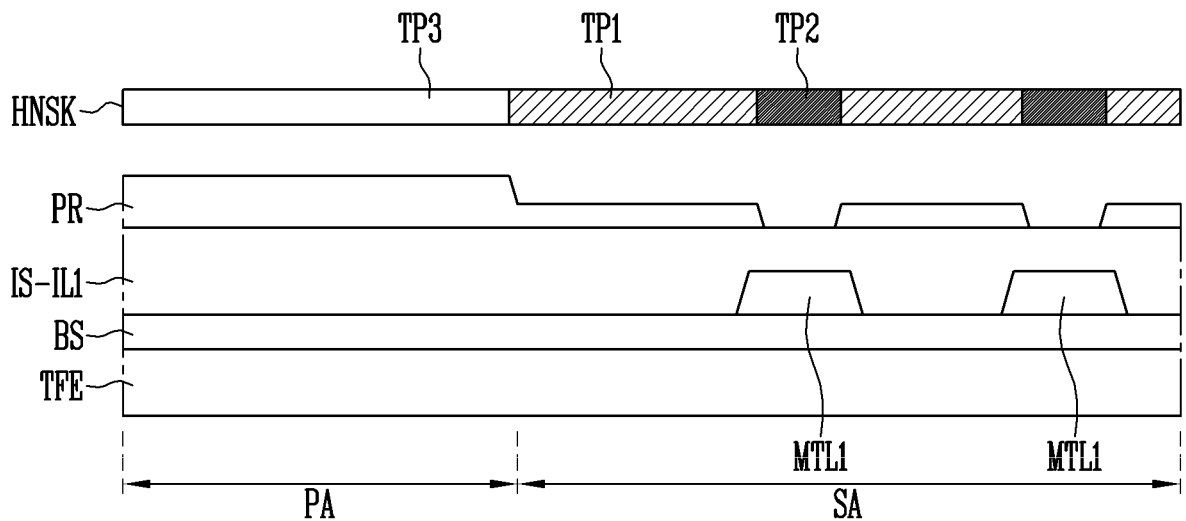

Referring to FIG. 7B, next, a first insulating layer IS-IL1 and a photoresist layer PR may be sequentially provided on the base part BS to cover the first conductive line MTL1. The first insulating layer IS-IL1 may be formed on the base part BS to correspond to the sensing region SA and the peripheral region PA, and the photoresist layer PR may be formed on the first insulating layer IS-IL1.

The first insulating layer IS-IL1 may have a single-layered or multi-layered structure, and include an inorganic material, an organic material, or a composite material.

The first insulating layer IS-IL1 may include an inorganic layer. The inorganic layer may include at least one of aluminum oxide, titanium oxide, silicon oxide, silicon oxynitride, zirconium oxide, and hafnium oxide.

The first insulating layer IS-IL1 may include an organic layer. The organic layer may include at least one of acryl-based resin, methacryl-based resin, polyisoprene, vinyl-based resin, epoxy-based resin, urethane-based resin, cellulose-based resin, siloxane-based resin, polyimide-based resin, polyamide-based resin, and perylene-based resin.

The photoresist layer PR may be provided on the first insulating layer IS-IL1. The photoresist layer PR may be made of a polymer material having solubility changed with respect to a developer as the photoresist layer PR is exposed to light. The photoresist layer PR may be a negative type photoresist layer that becomes insoluble with the developer as the photoresist layer is exposed to light. Alternatively, the photoresist layer PR may be a positive type photoresist layer that becomes soluble with the developer as the photoresist layer is exposed to light.

Subsequently, a contact hole CNT-D may be formed in the first insulating layer IS-IL1 such that a portion of the first insulating layer IS-IL1 on the first conductive line MTL1 is exposed. The contact hole CNT-D may be formed using a halftone mask HMSK. When the contact hole CNT-D is formed, the thickness of the first insulating layer IS-IL1 in the peripheral region PA may be formed different from that of the first insulating layer IS-IL1 in the sensing region SA. That is, the thickness of the first insulating layer IS-IL1 in the peripheral region PA may be formed thicker than that of the first insulating layer IS-IL1 in the sensing region SA, using the halftone mask HMSK, and simultaneously, the contact hole CNT-D may be formed.

In detail, the halftone mask HMSK may include a first light transmission part TP1 that has a first light transmittance, a second light transmission part TP2 that has a second light transmittance which is smaller than the first light transmittance, and a third light transmission part TP3 that has a third light transmittance larger than the first light transmittance. The halftone mask HMSK is disposed on the photoresist layer PR such that the first light transmission part TP1 corresponds to a region that is to become the first insulating layer IS-IL1 corresponding to the sensing region SA, the third light transmission part TP3 corresponds to a region that is to become the first insulating layer IS-IL1 corresponding to the peripheral region PA, and the second light transmission part TP2 corresponds to a region that is to become the contact hole CNT-D.

The photoresist layer PR is exposed and developed using the halftone mask HMSK. The photoresist layer PR shown in FIG. 7B is a negative type photoresist layer, and a portion of the photoresist layer PR, which is not exposed to light, may be removed through development. That is, as shown in FIG. 7B, a portion of the photoresist layer PR, which corresponds to the second light transmission part TP2 that allows light to be hardly transmitted therethrough in the halftone mask HMSK, is completely removed through the development process, and a portion of the photoresist layer PR, which corresponds to the third light transmission part TP3 that allows light to be entirely transmitted therethrough in the halftone mask HMSK, is not removed through the development process. In addition, a portion of the photoresist layer PR, which corresponds to the first light transmission part TP1 that has an intermediate light transmittance in the halftone mask HMSK, is partially removed through the development process.

Figure 7C:
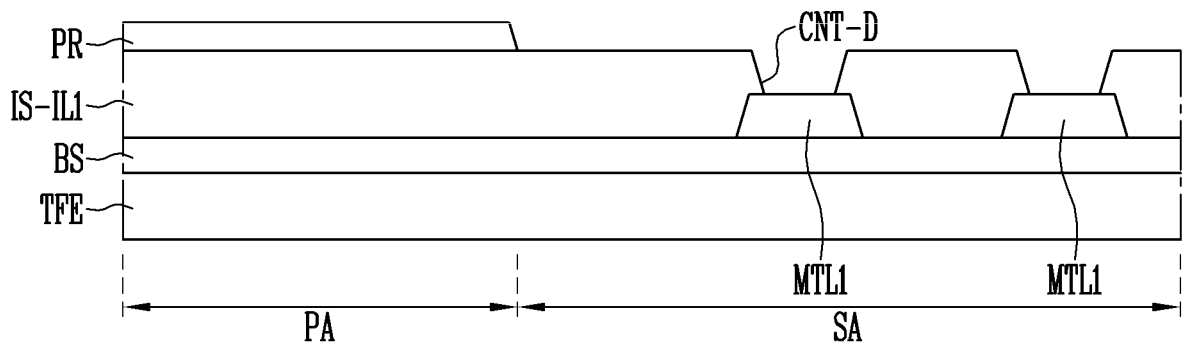

Referring to FIG. 7C, primary etching is performed using the developed photoresist layer PR as a mask. The contact hole CNT-D through which a portion of the first insulating layer IS-IL1 on the first conductive line MTL1 is exposed may be formed through the primary etching.

Referring to FIG. 7C, the developed photoresist layer PR is partially removed to expose a surface of the first insulating layer IS-IL1 corresponding to the sensing region SA is exposed but a surface of the first insulating layer IS-IL1 corresponding to the peripheral region PA is not exposed. Subsequently, secondary etching is performed using the photoresist layer PR that partially remains on the first insulating layer IS-IL1 in the peripheral region PA. Through the secondary etching, the thickness of the first insulating layer IS-IL1 corresponding to the peripheral region PA may be formed thicker than that of the first insulating layer IS-IL1 corresponding to the sensing region SA.

Figure 7D:
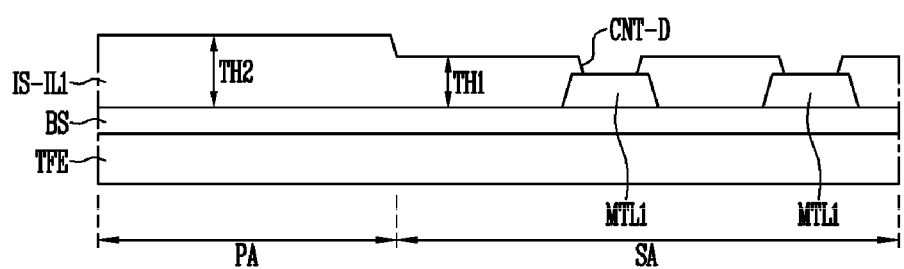

Referring to FIG. 7D, if the second etching is performed using the remained photoresist layer PR, the first insulating layer IS-IL1 corresponding to the peripheral region PA, on which the photoresist layer PR remains, is not etched, and the first insulating layer IS-IL1 corresponding to the sensing region SA, on which the photoresist layer PR does not remain, is etched. Therefore, through the secondary etching, the thickness TH2 of the first insulating layer IS-IL1 corresponding to the peripheral region PA may be formed larger than that TH1 of the first insulating layer IS-IL1 corresponding to the sensing region SA.

Subsequently, a second conductive layer is formed on the first insulating layer IS-IL1 to be in contact with the first conductive line MTL1 through the contact hole CNT-D. The second conductive layer may be formed on the base part BS to correspond to the sensing region SA and the peripheral region PA.

Like the first conductive layer, the second conductive layer may be a conductive layer having a single-layered or multi-layered structure.

Figure 7E:
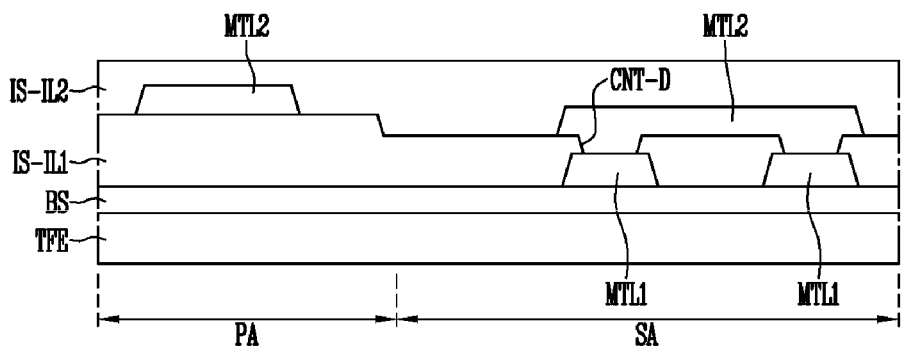

Referring to FIG. 7E, next, a second conductive line MTL2 may be formed by patterning the second conductive layer. The second conductive line MTL2 may be formed by patterning the second conductive layer, using a patterning mask. The second conductive line MTL2 may be formed corresponding to the sensing region SA and the peripheral region PA. The second conductive line MTL2 formed corresponding to the sensing region SA may be electrically connected to the first conductive line MTL1 through the contact hole CNT-D, to form a sensing electrode. The second conductive line MTL2 formed corresponding to the peripheral region PA may form signal lines.

Subsequently, a second insulating layer IS-IL2 may be formed on the second conductive line MTL2. The second insulating layer IS-IL2 may serve as a planarization layer while entirely covering the second conductive line MTL2.

The second insulating layer IS-IL2 may have a single-layered or multi-layered structure, and include an inorganic material, an organic material, or a composite material.

A pad portion may be formed by patterning the second insulating layer IS-IL2.

FIGS. 8A to 8F are sectional views of the input sensor, illustrating, step by step, a method for manufacturing the input sensor according to another embodiment of the present disclosure.

Figure 8A:
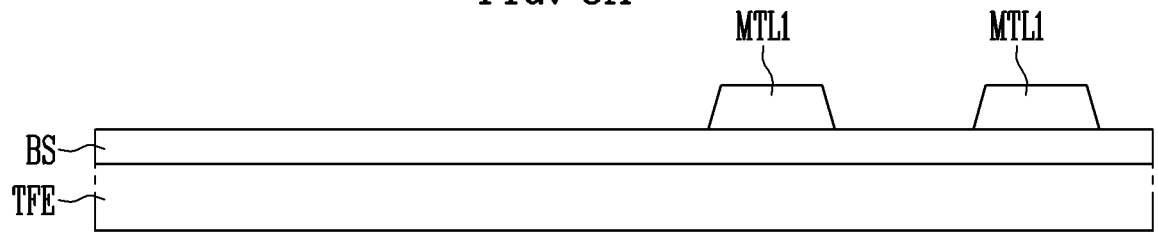
FIGS. 8A, 8B, 8C, 8D, 8E and 8F are sectional views of the input sensor, illustrating, step by step, a method for manufacturing the input sensor according to another embodiment of the present disclosure.

Referring to FIG. 8A, first, a base part BS may be formed on a thin film encapsulation layer TFE of the display device DD. The base part BS serves as a buffer layer. The base part BS may be made of silicon nitride (SiNx).

Next, a first conductive layer may be formed on the base part BS. The first conductive layer may be a conductive layer having a single-layered or multi-layered structure.

The conductive layer having the single-layered structure may include a metal layer or a transparent conductive layer. The metal layer may include molybdenum, silver, titanium, copper, aluminum, and any alloy thereof. The transparent conductive layer may include a transparent conductive oxide such as ITO, IZO, ZnO, or ITZO. In addition, the transparent conductive layer may include a conductive polymer such as PEDOT, a metal nano wire, graphene, and the like.

The conductive layer having the multi-layered structure may include may include multiple metal layers. The multiple metal layers may include, for example, a triple-layered structure of titanium/aluminum/titanium. The conductive layer having the multi-layered structure may include at least one metal layer and at least one transparent conductive layer.

Subsequently, a first conductive line MTL1 may be formed by patterning the first conductive layer. The first conductive line MTL1 may be formed by patterning the first conductive layer, using a patterning mask. The first conductive line MTL1 may be formed in a sensing region SA, and may not be formed in a peripheral region PA.

Referring to 8B, next, a first insulating layer IS-IL1 and a photoresist layer PR may be sequentially provided on the base part BS to cover the first conductive line MTL1. The first insulating layer IS-IL1 may be formed on the base part BS to correspond to the sensing region SA and the peripheral region PA, and the photoresist layer PR may be formed on the first insulating layer IS-IL1.

The first insulating layer IS-IL1 may have a single-layered or multi-layered structure, and include an inorganic material, an organic material, or a composite material.

The first insulating layer IS-IL1 may be formed with a uniform thickness in the sensing region SA and the peripheral region PA.

Subsequently, a contact hole CNT-D may be formed in the first insulating layer IS-IL1 such that a portion of the first insulating layer IS-IL1 on the first conductive line MTL1 is exposed. The contact hole CNT-D may be formed using a mask MSK1. The mask MSK1 may be an exposure mask.

Figure 8B:
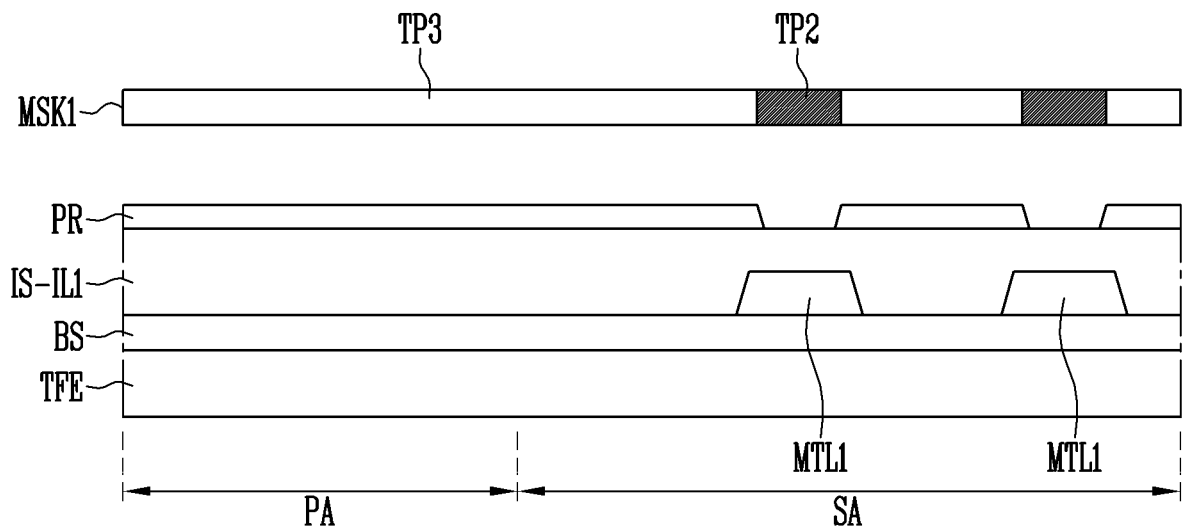

The mask MSK1 is disposed on the photoresist layer PR, and the photoresist layer PR is exposed and then developed. The photoresist layer PR shown in FIG. 8B is a negative type photoresist layer, and a portion of the photoresist layer PR, which is not exposed to light, may be removed through development. That is, as shown in FIG. 8B, a portion of the photoresist layer PR, which corresponds to a second light transmission part TP2 that allows light to be hardly transmitted therethrough in the mask MSK1, is removed through the development process, and a portion of the photoresist layer PR, which corresponds to a third light transmission part TP3 that allows light to be entirely transmitted therethrough in the mask MSK1, is not removed through the development process.

Figure 8C:
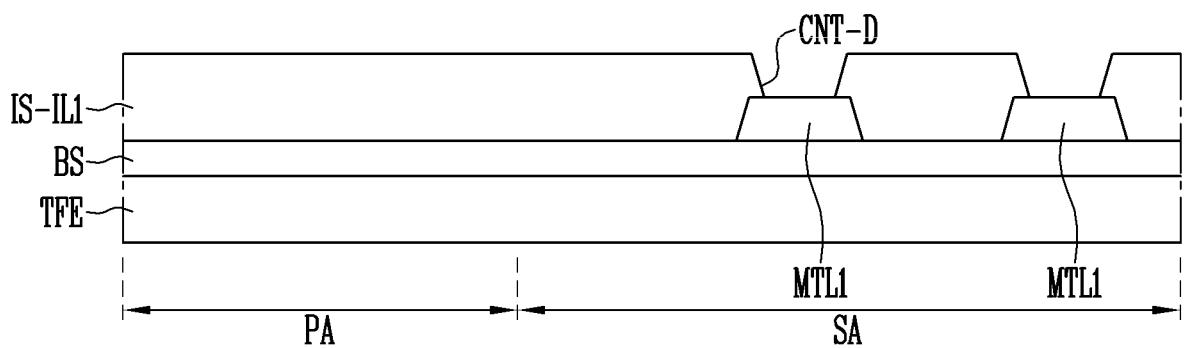

Referring to FIG. 8C, primary etching is performed using the developed photoresist layer PR as a mask. The contact hole CNT-D through which a portion of the first insulating layer IS-IL1 on the first conductive line MTL1 is exposed may be formed through the primary etching.

Figure 8D:
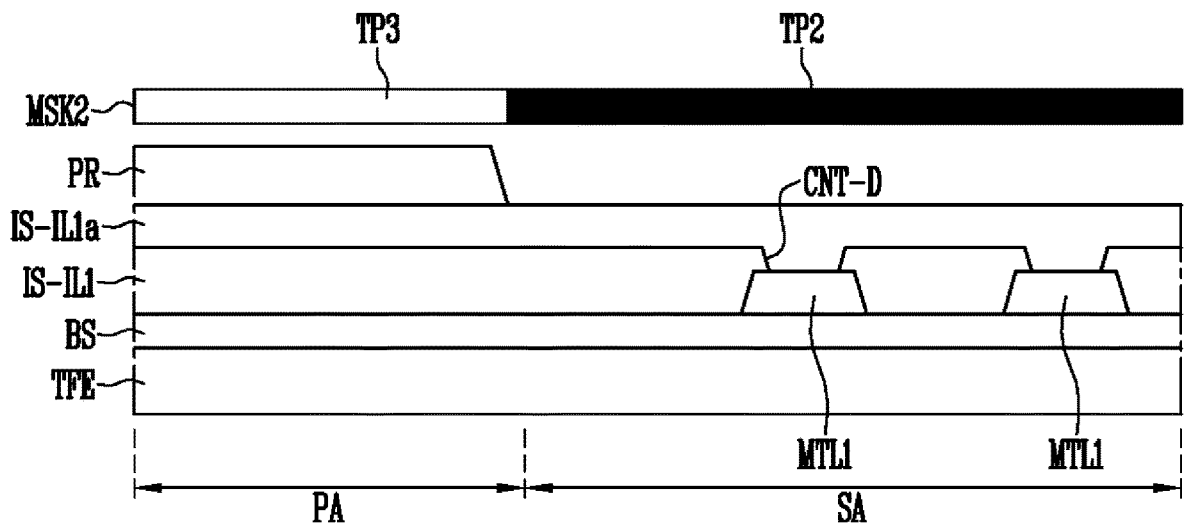

Subsequently, as shown in FIG. 8D, an additional insulating layer IS-IL1a is formed on the first insulating layer IS-IL1, a photoresist layer PR is formed on the additional insulating layer IS-IL1a, and a mask MSK2 is disposed on the photoresist layer PR. Then, the photoresist layer PR is exposed and developed.

The photoresist layer PR shown in FIG. 8D is a negative type photoresist layer, and a portion of the photoresist layer PR, which is not exposed to light, may be removed through development. That is, as shown in FIG. 8B, a portion of the photoresist layer PR, which corresponds to a second light transmission part TP2 that allows light to be hardly transmitted therethrough in the mask MSK2, is removed through the development process, and a portion of the photoresist layer PR, which corresponds to a third light transmission part TP3 that allows light to be entirely transmitted therethrough in the mask MSK2, is not removed through the development process. The photoresist layer PR corresponding to the peripheral region PA remains on the additional insulating layer IS-IL1a, and the photoresist layer PR corresponding to the sensing region SA is removed on the additional insulating layer IS-IL1a.

Figure 8E:
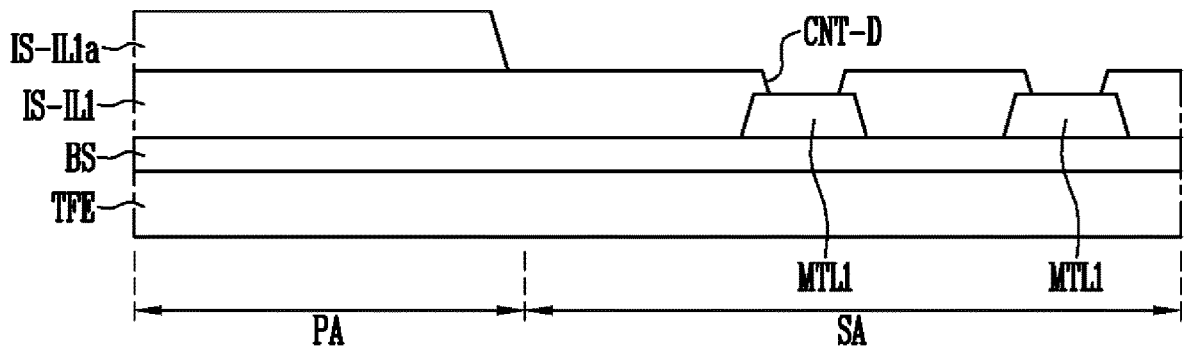

Subsequently, referring to FIG. 8E, secondary etching is performed using the photoresist layer PR that partially remains on the additional insulating layer IS-IL1a as a mask. Through the exposure process, the photoresist layer PR exists on the additional insulating layer IS-IL1a corresponding to the peripheral region PA, but does not exist on the additional insulating layer IS-IL1a corresponding to the sensing region SA. The additional insulating layer IS-IL1a corresponding to the peripheral region PA, on which the photoresist layer PR remains, is not etched, and the additional insulating layer IS-IL1a corresponding to the sensing region SA, on which the photoresist layer PR does not remain, is etched. Thus, as a result of the secondary etching, the first insulating layer IS-IL1 and the additional insulating layer IS-IL1a are stacked in the peripheral region PA, but only the first insulating layer IS-IL1 exists in the sensing region SA.

The additional insulating layer IS-IL1a may be made of the same material as the first insulating layer IS-IL1. However, the additional insulating layer IS-IL1a may be made of an insulating layer having an etching selectivity to the first insulating layer IS-IL1.

Thus, since the additional insulating layer IS-IL1a is additionally formed on the first insulating layer IS-IL1, corresponding to the peripheral region PA, the thickness of the insulating layer in the peripheral region PA is thicker than that of the insulating layer in the sensing region SA.

Figure 8F:
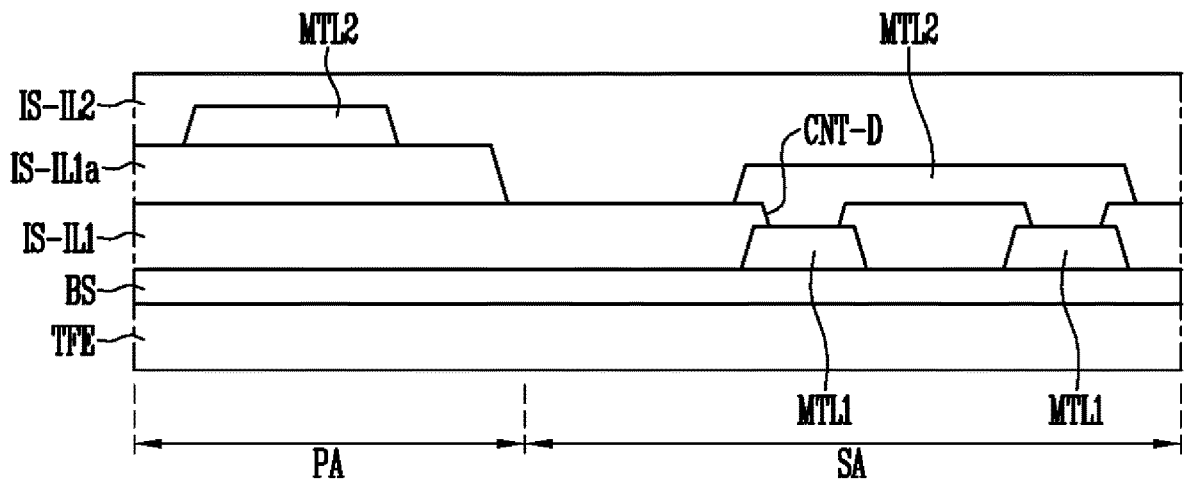

Referring to FIG. 8F, next, a second conductive layer is formed on the first insulating layer IS-IL1 to be in contact with the first conductive line MTL1 through the contact hole CNT-D. The second conductive layer may be formed on the base part BS to correspond to the sensing region SA and the peripheral region PA.

Like the first conductive layer, the second conductive layer may be a conductive layer having a single-layered or multi-layered structure.

Next, a second conductive line MTL2 may be formed by patterning the second conductive layer. The second conductive line MTL2 may be formed by patterning the second conductive layer, using a patterning mask. The second conductive line MTL2 may be formed corresponding to the sensing region SA and the peripheral region PA. The second conductive line MTL2 formed corresponding to the sensing region SA may be electrically connected to the first conductive line MTL1 through the contact hole CNT-D, to form a sensing electrode. The second conductive line MTL2 formed corresponding to the peripheral region PA may form signal lines.

Subsequently, a second insulating layer IS-IL2 may be formed on the second conductive line MTL2. The second insulating layer IS-IL2 may serve as a planarization layer while entirely covering the second conductive line MTL2.

The second insulating layer IS-IL2 may have a single-layered or multi-layered structure, and include an inorganic material, an organic material, or a composite material.

A pad portion may be formed by patterning the second insulating layer IS-IL2.

According to the present disclosure, the input sensing sensitivity of the input sensor can be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. An input sensor comprising:
    a base part including a sensing region corresponding to a display region and a peripheral region disposed at the periphery of the sensing region and outside the display region;
    a plurality of sensing electrodes provided in the sensing region;
    a cathode electrode provided in the sensing region and the peripheral region, wherein a portion of the cathode electrode is located on a dam part provided in the peripheral region;
    an insulating layer provided on the base part and insulating the plurality of sensing electrodes from each other; and
    a plurality of signal lines connected to the plurality of sensing electrodes, the plurality of signal lines being arranged to be spaced apart from each other, and the plurality of signal lines disposed in the peripheral region and above the cathode electrode with the insulating layer between,
    wherein a distance between signal lines overlapping the dam part among the plurality of signal lines and the portion of the cathode electrode located on the dam part is shorter than a distance between signal lines not overlapping the dam part among the plurality of signal lines and a portion of the cathode electrode not located on the dam part, and wherein a thickness of the insulating layer interposed between the signal lines overlapping the dam part and the portion of the cathode electrode located on the dam part in the peripheral region is thicker than the thickness of the insulating layer interposed between the signal lines not overlapping the dam part and the portion of the cathode electrode not located on the dam part in the sensing region.

2. The input sensor of claim 1, wherein, when the signal lines are provided on the insulating layer corresponding to the peripheral region, the distance between the signal lines and the base part is larger than the thickness of the insulating layer corresponding to the sensing region.

3. The input sensor of claim 1, wherein the plurality of sensing electrodes have a mesh pattern.

4. The input sensor of claim 3, wherein the plurality of sensing electrodes include a first mesh pattern and a second mesh pattern provided on the first mesh pattern,
wherein the insulating layer is provided between the first mesh pattern and the second mesh pattern, and
the second mesh pattern is electrically connected to the first mesh pattern by at least one contact hole passing through the insulating layer.

5. The input sensor of claim 4, wherein the thickness of the insulating layer disposed between the signal lines and the base part is thicker than that of the insulating layer disposed between the first mesh pattern and the second mesh pattern.

6. The input sensor of claim 4, wherein the signal lines are connected to the second mesh pattern, and include the same material as the second mesh pattern.

7. The input sensor of claim 3, wherein the plurality of sensing electrodes include:
a first sensing electrode formed to extend in a first direction; and
a second sensing electrode formed to extend in a second direction intersecting the first direction,
wherein the first sensing electrode includes a plurality of first sensor parts arranged along the first direction and a first connection part allowing the first sensor parts to be connected to each other, and
the second sensing electrode includes a plurality of second sensor parts arranged along the second direction and a second connection part allowing the second sensor parts to be connected to each other,
wherein the first sensor parts and the second sensor parts are disposed on the same layer or on different layers, and
one of the first connection part and the second connection part is disposed on the same layer as the first sensor parts.

8. A display device comprising:
a display panel including a display region and a non-display region disposed at the periphery of the display region; and
an input sensor provided on the display panel,
wherein the input sensor includes:
a base part including a sensing region and a peripheral region disposed at the periphery of the sensing region;
a plurality of sensing electrodes provided in the sensing region;
a cathode electrode provided in the sensing region and the peripheral region, wherein a portion of the cathode electrode is located on a dam part provided in the peripheral region;
an insulating layer provided on the base part and insulating the plurality of sensing electrodes from each other; and
a plurality of signal lines connected to the plurality of sensing electrodes, the plurality of signal lines being arranged to be spaced apart from each other, and the plurality of signal lines disposed in the non-display region and above the cathode electrode with the insulating layer between,
wherein a distance between signal lines overlapping the dam part among the plurality of signal lines and the portion of the cathode electrode located on the dam part is shorter than a distance between signal lines not overlapping the dam part among the plurality of signal lines and a portion of the cathode electrode not located on the dam part, and
wherein a thickness of the insulating layer interposed between the signal lines overlapping the dam part and the portion of the cathode e lectrode located on the dam part in the peripheral region is thicker than the thickness of the insulating layer interposed between the signal lines not overlapping the dam part and the portion of the cathode electrode not located on the dam part in the sensing region.

9. The display device of claim 8, wherein the display panel includes:
a substrate;
a light emitting device provided on the substrate; and
an encapsulation layer covering the light emitting device, the encapsulation layer including one or more layers.

10. The display device of claim 8, wherein, when the signal lines are provided on the insulating layer corresponding to the peripheral region, the distance between the signal lines and the base part is larger than the thickness of the insulating layer corresponding to the sensing region.

11. The display device of claim 8, wherein the plurality of sensing electrodes have a mesh pattern.

12. The display device of claim 11, wherein the plurality of sensing electrodes include a first mesh pattern and a second mesh pattern provided on the first mesh pattern,
wherein the insulating layer is provided between the first mesh pattern and the second mesh pattern, and
the second mesh pattern is electrically connected to the first mesh pattern by at least one contact hole passing through the insulating layer.

13. The display device of claim 12, wherein the thickness of the insulating layer disposed between the signal lines and the base part is thicker than that of the insulating layer disposed between the first mesh pattern and the second mesh pattern.

14. The display device of claim 12, wherein the signal lines are connected to the second mesh pattern, and include the same material as the second mesh pattern.

15. The display device of claim 11, wherein the plurality of sensing electrodes include:
a first sensing electrode formed to extend in a first direction; and
a second sensing electrode formed to extend in a second direction intersecting the first direction,
wherein the first sensing electrode includes a plurality of first sensor parts arranged along the first direction and a first connection part allowing the first sensor parts to be connected to each other, and the second sensing electrode includes a plurality of second sensor parts arranged along the second direction and a second connection part allowing the second sensor parts to be connected to each other, wherein the first sensor parts and the second sensor parts are disposed on the same layer or on different layers, and one of the first connection part and the second connection part is disposed on the same layer as the first sensor parts.

16. A method for manufacturing an input sensor, the method comprising:

providing a base part that includes a sensing region corresponding to a display region and a peripheral region disposed at the periphery of the sensing region and outside the display region;

providing a first conductive layer on the base part;

forming a first conductive line by patterning the first conductive layer;

providing a cathode electrode in the sensing region and the peripheral region, wherein a portion of the cathode electrode is located on a dam part provided in the peripheral region;

providing an insulating layer on the base part and the first conductive line;

forming a contact hole in the insulating layer such that a portion of the first conductive line is exposed;

providing a second conductive layer in the peripheral region and on the insulating layer to be in contact with the first conductive line through the contact hole, with the insulating layer between the cathode electrode and the second conductive layer; and forming a second conductive line by patterning the second conductive layer, wherein a distance between signal lines overlapping the dam part among the plurality of signal lines and the portion of the cathode electrode located on the dam part is shorter than a distance between signal lines not overlapping the dam part among the plurality of signal lines and a portion of the cathode electrode not located on the dam part, and wherein a thickness of the insulating layer interposed between the signal lines overlapping the dam part and the portion of the cathode electrode located on the dam part in the peripheral region is formed thicker than that thickness of the insulating layer interposed between the signal lines not overlapping the dam part and the portion of the cathode electrode not located on the dam part in the sensing region.

17. The method of claim 16, wherein, in the forming of the contact hole, the contact hole is formed by forming the thickness of the insulating layer corresponding to the peripheral region to be larger than that of the insulating layer corresponding to the sensing region, using a halftone mask.

18. The method of claim 16, comprising, before the providing of the second conductive layer after the forming of the contact hole, forming an additional insulating layer on the insulating layer corresponding to the peripheral region.

* * * * *